United States Patent [19]

Okonogi et al.

[11] Patent Number: 5,420,064

[45] Date of Patent: May 30, 1995

[54] METHOD OF MANUFACTURING A DIELECTRIC ISOLATION SUBSTRATE

[75] Inventors: Kensuke Okonogi, Tokyo; Tsukasa Ohoka, Shiga, both of Japan

[73] Assignee: NEC Corporation, Tokyo, Japan

[21] Appl. No.: 310,076

[22] Filed: Sep. 22, 1994

[30] Foreign Application Priority Data

Sep. 28, 1993 [JP] Japan .................. 5-241173

[51] Int. Cl.$^6$ ............................. H01L 21/76
[52] U.S. Cl. ......................... 437/63; 437/62; 437/974; 148/DIG. 12; 148/DIG. 135
[58] Field of Search ............... 437/62, 974, 63; 148/DIG. 12, DIG. 135

[56] References Cited

U.S. PATENT DOCUMENTS

| | | | |
|---|---|---|---|
| 4,971,925 | 11/1990 | Alexander et al. | 437/62 |
| 5,081,061 | 1/1992 | Rouse et al. | 437/62 |
| 5,183,783 | 2/1993 | Ohta et al. | 437/974 |

FOREIGN PATENT DOCUMENTS

| | | | |
|---|---|---|---|
| 0202035 | 8/1988 | Japan | 437/62 |
| 0142854 | 6/1991 | Japan | 437/62 |
| 0252154 | 11/1991 | Japan | 437/62 |
| 0045429 | 2/1994 | Japan | 437/62 |

OTHER PUBLICATIONS

T. Sugawara et al., "New Dielectric Isolation for High Voltage . . . Direct Bonding (SPSDB) Technique", Proceedings of 1992 International Symposium on Power Semiconductor Devices & ICs, Tokyo, pp. 316–321.

*Primary Examiner*—Brian E. Hearn
*Assistant Examiner*—Trung Dang
*Attorney, Agent, or Firm*—Sughrue, Mion, Zinn, Macpeak & Seas

[57] ABSTRACT

According to this invention, there is provided a method of manufacturing a semiconductor device, including the steps of anisotropically etching a surface of an n-type monocrystalline silicon substrate having the (100) plane to form a V-shaped isolation groove having a depth $d_1$, performing ion implantation and performing annealing and diffusion to a surface of the V-shaped isolation groove to form an $n^+$-type buried layer, depositing a silicon dioxide film having a thickness $d_2$ on a surface of the $n^+$-type buried layer, forming a polycrystalline silicon film on a surface of the silicon dioxide film, abrading and polishing the polycrystalline silicon film to have a thickness $d_3$, adhering a monocrystalline silicon support substrate having a thickness $d_4$ to a polished surface of the polycrystalline silicon film at room temperature in the atmospheric air, abrading and polishing a lower surface of the n-type monocrystalline silicon substrate having the V-shaped isolation groove to expose the silicon dioxide film at a bottom portion of the V-shaped isolation groove on the lower surface and to form an island-like monocrystalline silicon film, wherein the thicknesses $d_1$, $d_2$, $d_3$, and $d_4$ are set to be 50 to 60 μm, 1 to 3 μm, 0 to 30 μm, and 350 to 450 μm, respectively.

3 Claims, 5 Drawing Sheets

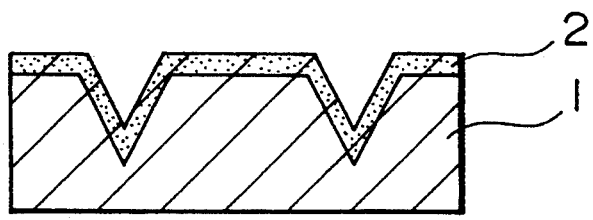
FIG. IA
PRIOR ART
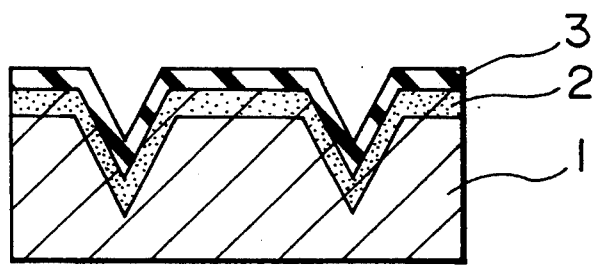
FIG. IB
PRIOR ART
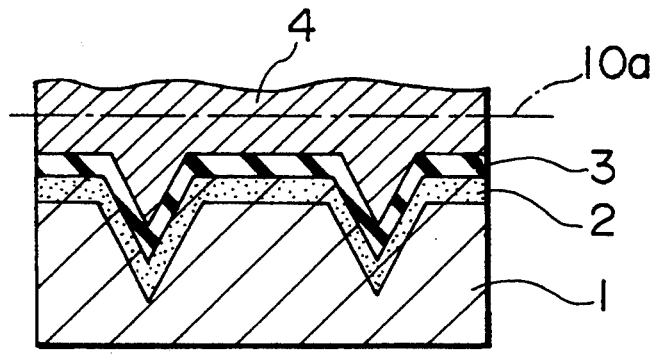
FIG. IC
PRIOR ART
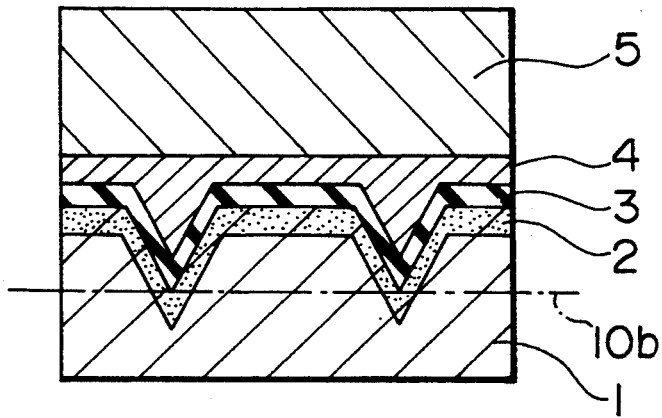
FIG. ID
PRIOR ART
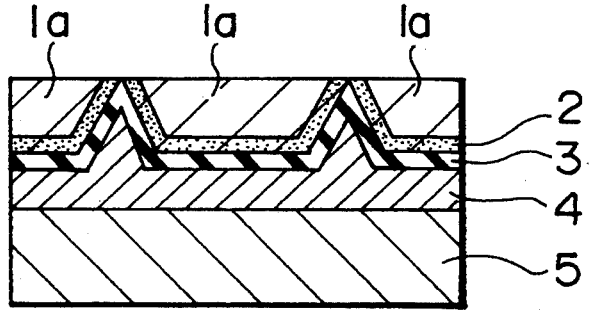
FIG. IE
PRIOR ART

METHOD OF MANUFACTURING A DIELECTRIC ISOLATION SUBSTRATE

BACKGROUND OF THE INVENTION

1. Field of the Invention

The present invention relates to a dielectric isolation substrate for a semiconductor device and a method of manufacturing the dielectric isolation substrate and, more particularly, to a composite substrate for isolating a high-breakdown-voltage element from other elements and a method of manufacturing the composite substrate.

2. Description of the Prior Art

The structure of the conventional dielectric isolation substrate and a method of manufacturing the dielectric isolation substrate will be described below with reference to FIGS. 1A to 1E. An example of the dielectric isolation substrate is described in International Symposium on Power Semiconductor Devices and ICs, '92, pp. 316–321. After V-shaped grooves are formed in a monocrystalline silicon substrate 1, an n+-type buried layer 2 is formed on the surface of the monocrystalline silicon substrate 1 (FIG. 1A).

Thereafter, a silicon dioxide film 3 is formed on the surface of the n+-type buried layer 2 (FIG. 1B).

A polycrystalline silicon film 4 is formed on the surface of the silicon dioxide film 3 and then abraded and polished to an abrasion surface 10a to have a predetermined thickness (FIG. 1C).

Thereafter, the abrasion surface 10a adheres to a monocrystalline silicon support substrate 5. In this case, the monocrystalline silicon support substrate 5 having a thickness of 300 to 500 $\mu$m is used (FIG. 1D).

The monocrystalline silicon substrate 1 is polished to obtain island-like monocrystalline silicon films 1a (FIG. 1E). Note that FIG. 1E shows a structure obtained by turning the structure in FIG. 1D upside-down.

Since this conventional dielectric isolation substrate has a large amount of warpage and many crystal defects, the yield in the subsequent step decreases. In case of a large amount of warpage, when the polycrystalline silicon film 4 filled in the V-shaped groove in FIG. 1E or a trench is to be polished, the polycrystalline silicon film 4 has different polishing rates at the peripheral and central portions of the substrate. For this reason, the island-like monocrystalline silicon films 1a have different thicknesses, respectively, and the breakdown voltages of the high-breakdown-voltage elements vary. In addition, when many crystal defects are present in an element, the defects decrease the lifetimes of carriers or cause leakage.

SUMMARY OF THE INVENTION

The present invention has been made in consideration of the above situation, and has as its object to provide a semiconductor device capable of reducing an amount of warpage and the number of crystal defects by optimizing a structure in a dielectric isolation substrate on which a high-breakdown-voltage element and other elements are integrated as one chip, and a method of manufacturing the semiconductor substrate.

In order to achieve the above object, according to the main aspect of the present invention, there is provided a method of manufacturing a semiconductor device, comprising the steps of anisotropically etching a surface of an n-type monocrystalline silicon substrate having the (100) plane to form a V-shaped isolation groove having a depth $d_1$, performing ion implantation and performing annealing and diffusion to a surface of the V-shaped isolation groove to form an n+-type buried layer, depositing a silicon dioxide film having a thickness $d_2$ on a surface of the n+-type buried layer, forming a polycrystalline silicon film on a surface of the silicon dioxide film, abrading and polishing the polycrystalline silicon film to have a thickness $d_3$, adhering a monocrystalline silicon support substrate having a thickness $d_4$ to a polished surface of the polycrystalline silicon film at room temperature in the atmospheric air, abrading and polishing a lower surface of the n-type monocrystalline silicon substrate having the V-shaped isolation groove to expose the silicon dioxide film at a bottom portion of the V-shaped isolation groove on the lower surface and to form an island-like monocrystalline silicon film, wherein the thicknesses $d_1$, $d_2$, $d_3$, and $d_4$ are set to be 50 to 60 $\mu$m, 1 to 3 $\mu$m, 0 to 30 $\mu$m, and 350 to 450 $\mu$m, respectively.

According to the main aspect of the present invention, the polycrystalline silicon film is abraded and polished through a mechanical and chemical action.

The manufacturing method according to the main aspect of the present invention further comprises the step of performing annealing at a temperature of 1,100° C. in an N$_2$ gas atmosphere for 2 hours after the polycrystalline silicon film adheres to the monocrystalline silicon support substrate in the step of adhering the polycrystalline silicon film to the monocrystalline silicon support substrate.

According to the manufacturing method of the present invention, an amount of warpage of a manufactured semiconductor device can be suppressed to 50 $\mu$m or less, a crystal defect density can be set to be $1 \times 10^4$ defects/cm$^2$ or less. As a result, an island-like monocrystalline silicon film can be uniformly formed in a high productivity, the yield of one substrate becomes 90% or more. In addition, the number of defective products caused by crystal defects is almost zero. Therefore, the manufacturing method is suitable for mass production.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

BRIEF DESCRIPTION OF THE DRAWINGS

FIGS. 1A to 1E are sectional views showing process charts relating to a conventional manufacturing method;

DETAILED DESCRIPTION OF THE INVENTION

The present invention will be described in detail with reference to FIGS. 2 to 5.

Figure 2:
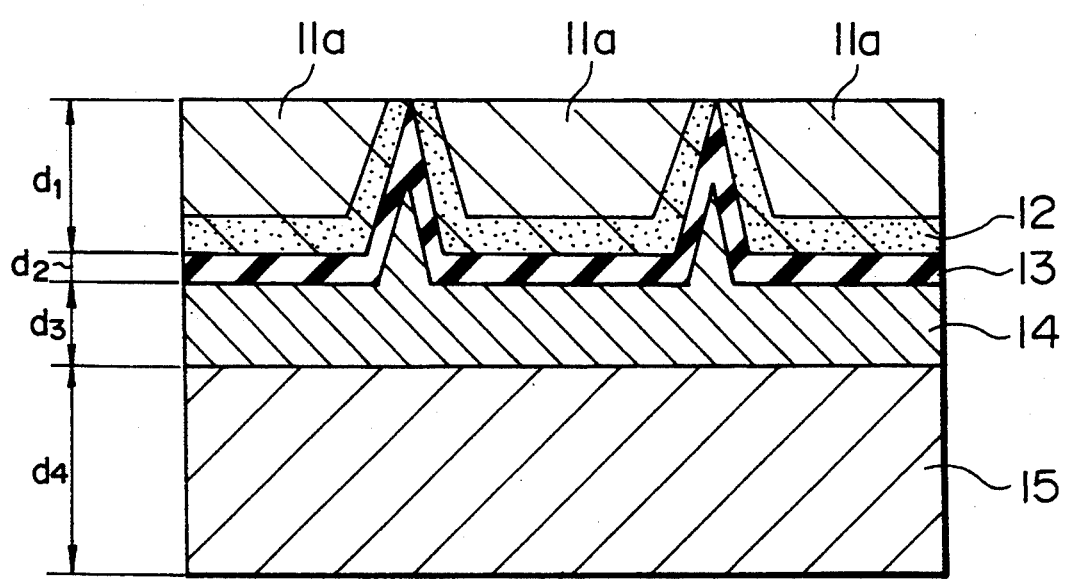
FIG. 2 is a sectional view showing a semiconductor device according to an embodiment of the present invention.

FIG. 2 is a sectional view showing the structure of a semiconductor device according to one embodiment of the present invention. Although this structure is the same as that of the prior art shown in FIG. 1E, a film thickness $d_1$ of an island-like monocrystalline silicon film 11a, a film thickness $d_2$ of a silicon dioxide film 13, a film thickness $d_3$ of a polycrystalline silicon film 14, and a film thickness $d_4$ of a monocrystalline silicon support substrate 15 are optimized.

These thicknesses are designed as follows:
$d_1 = 50$ to $60$ $\mu m$, $d_2 = 1$ to $3$ $\mu m$
$d_3 = 0$ to $30$ $\mu m$, and $d_4 = 350$ to $450$ $\mu m$.

An example of a manufacturing method according to the present invention is shown in FIGS. 3A to 3E. This manufacturing method will be described below.

V-shaped isolation grooves each having a depth of about 50 $\mu m$ are selectively formed in a CZ, n-type monocrystalline silicon substrate 11 by anisotropic wet etching using a KOH-based solution. The monocrystalline silicon substrate 11 has the (100) plane and a resistivity of about 20 $\Omega.cm$.

Figure 3A:
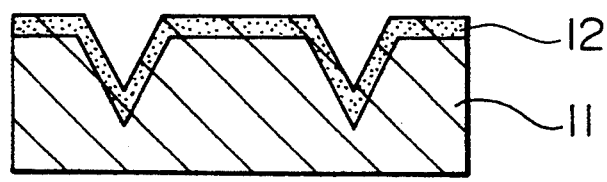
FIGS. 3A to 3E are sectional views showing process charts relating to a manufacturing method according to the present invention.

Thereafter, As ions are implanted by an ion-implantation method and then diffused by annealing to form an n+-type buried layer 12 (FIG. 3A).

Figure 3B:
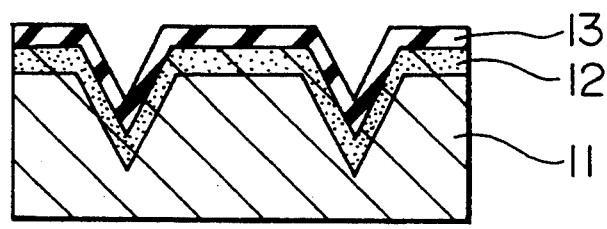

Thereafter, the silicon dioxide film 13 is formed on the surface of the n+-type buried layer 12 by a thermal oxidation method to have a thickness of about 3 $\mu m$ (FIG. 3B).

Figure 3C:
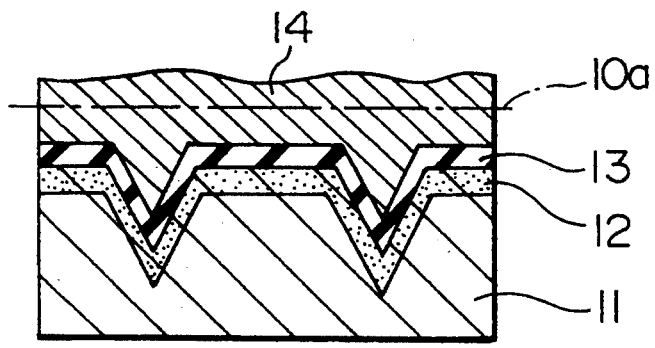

The polycrystalline silicon film 14 having a thickness of about 100 $\mu m$ is grown on the surface of the silicon dioxide film 13 at a high temperature of 1,000° C. or more using a silane gas as a source gas (FIG. 3C).

Figure 3D:
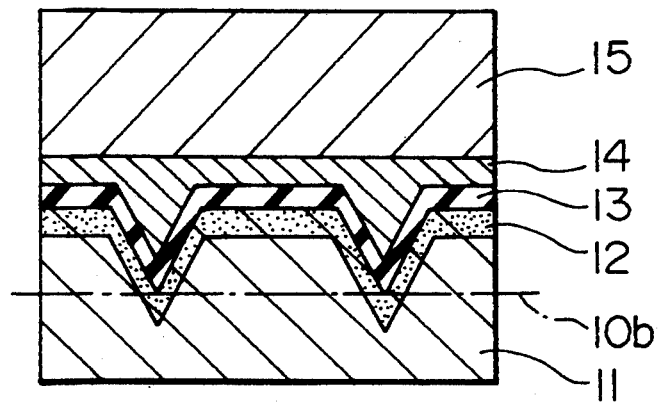

The grown polycrystalline silicon film 14 is abraded and polished to a predetermined polishing surface 10a to have a thickness of 0 to 30 $\mu m$, and the monocrystalline silicon support substrate 15 adheres to the polycrystalline silicon film 14 at room temperature. Thereafter, the resultant structure is annealed at 1,100° C. for 2 hours (FIG. 3D).

Figure 3E:
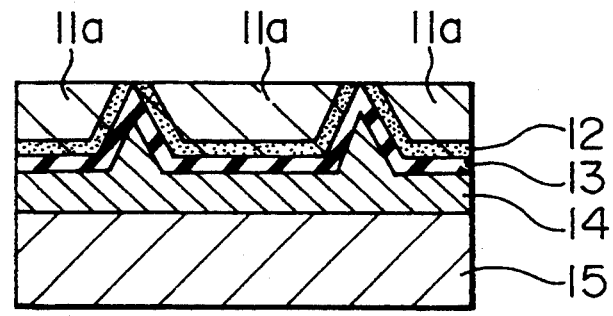

The monocrystalline silicon support substrate 15 is abraded and polished to a polishing surface 10b on which the silicon dioxide film 13 is exposed, thereby forming island-like monocrystalline silicon films 11a (FIG. 3E).

Figure 4:
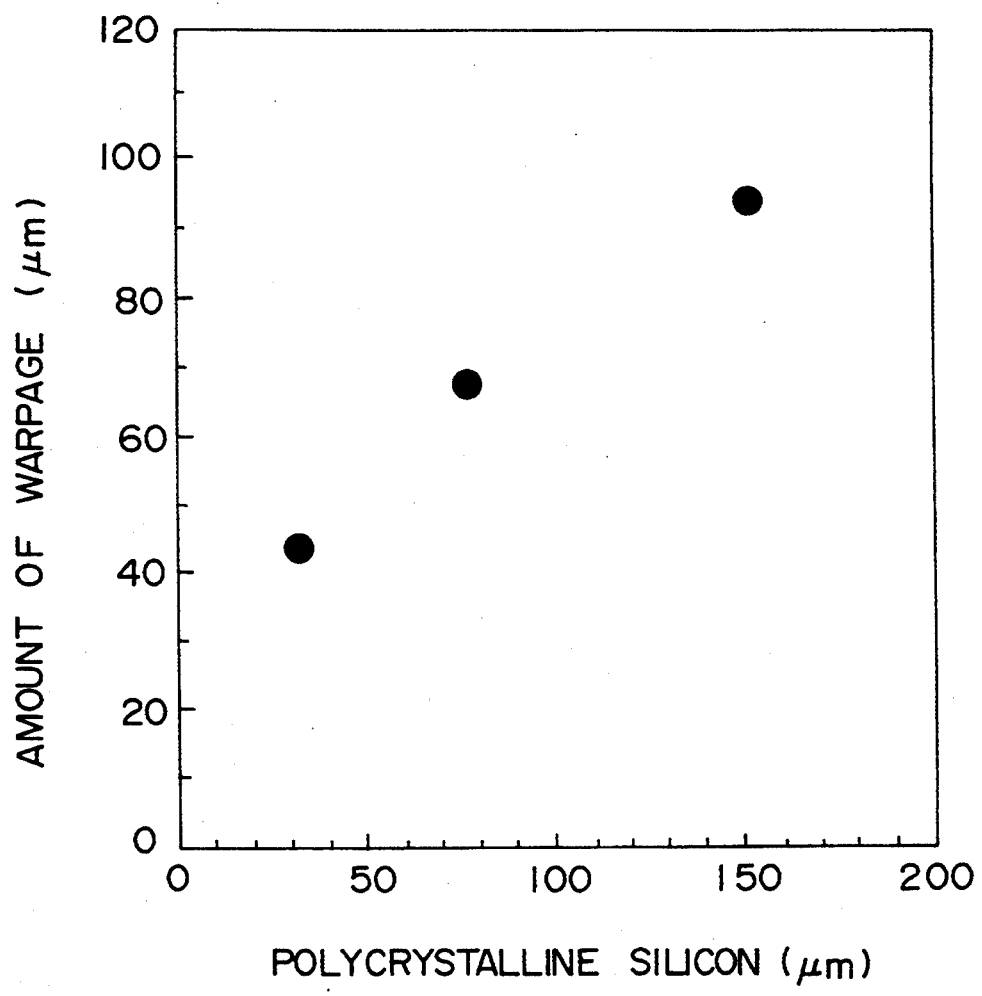
FIG. 4 is a graph showing the relationship between the thickness of a polycrystalline silicon film and an amount of warpage in a semiconductor device according to the present invention.

FIG. 4 is a graph showing an amount of warpage obtained when the thickness $d_3$ of the polycrystalline silicon film 14 in the structure of a semiconductor device (4 inches) according to the present invention. As is apparent from this graph, when the film thickness $d_3$ of the polycrystalline silicon film 14 is 50 $\mu m$ or less, an amount of warpage equal to the amount of warpage (40 $\mu m$ or less) of a conventional silicon wafer can be obtained. More specifically, the amount of warpage reduces with a decrease in thickness of the polycrystalline silicon film 14.

Since polycrystalline silicon, silicon dioxide, and monocrystalline silicon have different thermal expansion coefficients, respectively, when these films are annealed, the semiconductor device substrate is warped by stresses. For this reason, the above three optimal film thicknesses are present.

Figure 5:
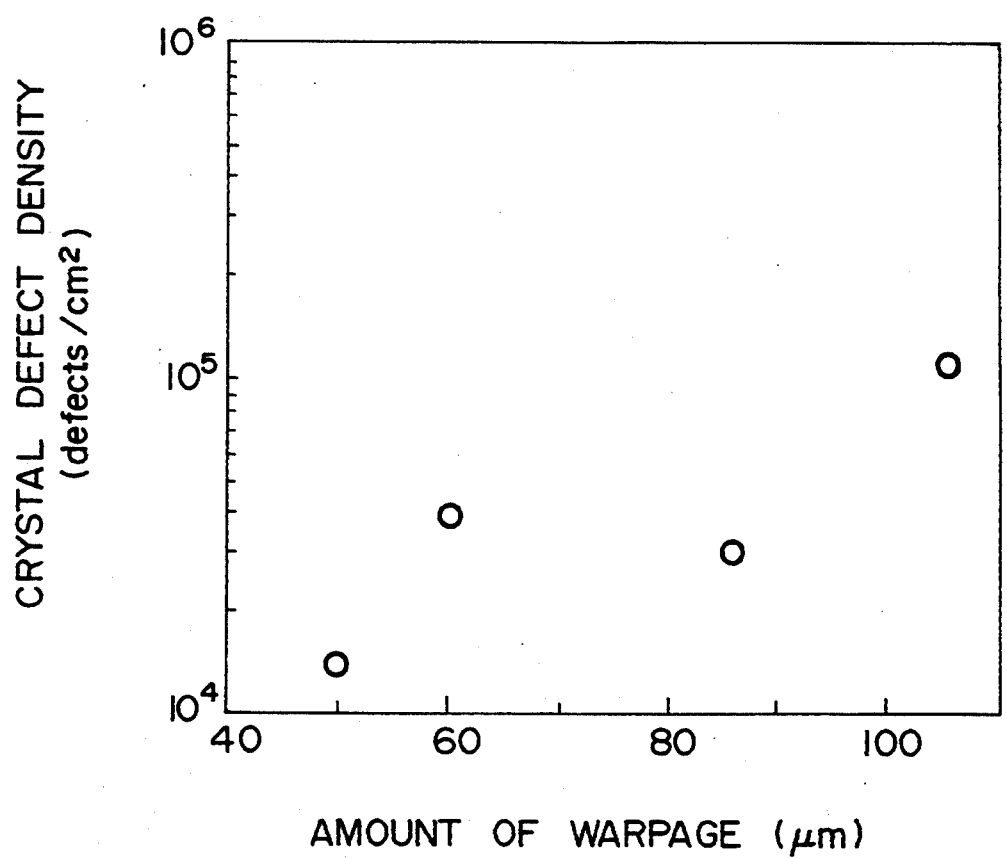
FIG. 5 is a graph showing the relationship between an amount of warpage and a crystal defect density in the semiconductor device according to the present invention.

In FIG. 5 showing a graph obtained by examining an amount of warpage and a crystal defect density which are obtained when the film thickness $d_3$ of the polycrystalline silicon film 14 is changed, it is understood that the crystal defect density increases with an increase in amount of warpage. Crystal defects are caused by stresses, and a reduction of amount of warpage reduces the crystal defect density. For this reason, it is important to optimize the structure of the semiconductor device. In other words, a decrease in current amplification factor of a bipolar device formed on the substrate can be prevented.

What we claimed is:

1. A method of manufacturing a semiconductor device, comprising the steps of anisotropically etching a surface of an n-type monocrystalline silicon substrate having the (100) plane to form a V-shaped isolation groove having a depth $d_1$, performing ion implantation and performing annealing and diffusion to a surface of said V-shaped isolation groove to form an n+-type buried layer, depositing a silicon dioxide film having a thickness $d_2$ on a surface of said n+-type buried layer, forming a polycrystalline silicon film on a surface of said silicon dioxide film, abrading and polishing said polycrystalline silicon film to have a thickness $d_3$, adhering a monocrystalline silicon support substrate having a thickness $d_4$ to a polished surface of said polycrystalline silicon film at room temperature in the atmospheric air, abrading and polishing a lower surface of said n-type monocrystalline silicon substrate having said V-shaped isolation groove to expose said silicon dioxide film at a bottom portion of said V-shaped isolation groove on said lower surface and to form an island-like monocrystalline silicon film, wherein the thicknesses $d_1$, $d_2$, $d_3$, and $d_4$ are set to be 50 to 60 $\mu m$, 1 to 3 $\mu m$, 0 to 30 $\mu m$, and 350 to 450 $\mu m$, respectively.

2. A method according to claim 1, wherein said polycrystalline silicon film is abraded and polished through a mechanical and chemical action.

3. A method according to claim 1, further comprising the step of performing annealing at a temperature of 1,100° C. in an $N_2$ gas atmosphere for 2 hours after said polycrystalline silicon film adheres to said monocrystalline silicon support substrate in the step of adhering said polycrystalline silicon film to said monocrystalline silicon support substrate.

* * * * *